United States Patent
Tan et al.

(10) Patent No.: US 9,703,993 B2
(45) Date of Patent: Jul. 11, 2017

(54) SYSTEM AND METHOD FOR TESTING PERFORMANCE OF MOBILE RADIO FREQUENCY IDENTIFICATION TAG

(71) Applicant: INSTITUTE OF AUTOMATION, CHINESE ACADEMY OF SCIENCES, Haidian District, Beijing (CN)

(72) Inventors: Jie Tan, Beijing (CN); Na Mao, Beijing (CN); Hongsheng Zhao, Beijing (CN); Xiaofeng Ning, Beijing (CN)

(73) Assignee: INSTITUTE OF AUTOMATION, CHINESE ACADEMY OF SCIENCES, Haidian District, Beijing (CN)

( * ) Notice: Subject to any disclaimer, the term of this patent is extended or adjusted under 35 U.S.C. 154(b) by 29 days.

(21) Appl. No.: 14/784,328

(22) PCT Filed: Apr. 8, 2014

(86) PCT No.: PCT/CN2014/074879
§ 371 (c)(1),
(2) Date: Oct. 14, 2015

(87) PCT Pub. No.: WO2014/169769
PCT Pub. Date: Oct. 23, 2014

(65) Prior Publication Data
US 2016/0042204 A1    Feb. 11, 2016

(30) Foreign Application Priority Data

Apr. 17, 2013 (CN) .......................... 2013 1 0133253

(51) Int. Cl.
*G08B 13/14* (2006.01)
*G06F 19/00* (2011.01)
(Continued)

(52) U.S. Cl.
CPC .......... *G06K 7/0095* (2013.01); *G01V 15/00* (2013.01); *G06K 7/0008* (2013.01);
(Continued)

(58) Field of Classification Search
CPC ............... G01R 31/2822; G06K 19/00; G06K 19/0723; G06K 7/0095; G06K 19/07749;
(Continued)

(56) References Cited

U.S. PATENT DOCUMENTS

2007/0279224 A1* 12/2007 Branigan ............... G06Q 10/08
340/572.1
2009/0024309 A1*  1/2009 Crucs ..................... G08G 1/015
701/118

(Continued)

FOREIGN PATENT DOCUMENTS

CN       101344932 A    1/2009
CN       101872885 A    10/2010
(Continued)

OTHER PUBLICATIONS

International Search Report for corresponding International Patent Application No. PCT/CN2014074879 mailed Jul. 15, 2014.

*Primary Examiner* — Dionne H Pendleton
(74) *Attorney, Agent, or Firm* — Merchant & Gould P.C.

(57) ABSTRACT

A system for testing performance of mobile Radio Frequency Identification tags, comprising: a test device including a mobile car and a test channel; the test channel comprises a magnetic label on a ground for labeling a test driving route of the mobile car and a framework fixed on to the ground and provided with a reading device for the RFID tags; a magnetic recognition device is provided at a bottom of the mobile car to identify to the magnetic label and the mobile car is driven along the test driving route; the plurality of RFID tags are fixed on under-test goods loaded on the
(Continued)

mobile car; a testing equipment configured to control the reading device to identify the RFID tags fixed on under-test goods; wherein the RFID tags are fixed on to under-test goods which are loaded on the mobile car. The performance test experiment of identifying RFID tags is repeated to get the best recognition rate by adjusting the status of the reader and reader antennas and the speed of the mobile car. According to the present disclosure, individual customization on the position and angle of the reader antennas placed with and the moving speed of under-test goods may be obtained to identify all the RFID tags on the fixed position of the goods so as to provide a reference for using the RFID tags in the manufacturing lines and the logistics systems.

20 Claims, 2 Drawing Sheets

(51) Int. Cl.

| | | |
|---|---|---|
| G06Q 10/08 | (2012.01) | |
| G06K 7/00 | (2006.01) | |
| G07B 15/02 | (2011.01) | |
| G08G 1/00 | (2006.01) | |
| G06K 7/10 | (2006.01) | |
| G08G 1/052 | (2006.01) | |
| G01V 15/00 | (2006.01) | |
| H01Q 1/12 | (2006.01) | |
| G06K 19/00 | (2006.01) | |
| G06K 19/07 | (2006.01) | |
| G08G 1/017 | (2006.01) | |
| G06K 17/00 | (2006.01) | |
| G07C 9/00 | (2006.01) | |
| G01R 31/28 | (2006.01) | |

(52) U.S. Cl.
CPC ......... *G06K 7/10356* (2013.01); *G06K 19/00* (2013.01); *G06K 19/0723* (2013.01); *G06Q 10/087* (2013.01); *G07B 15/02* (2013.01); *G08G 1/017* (2013.01); *G08G 1/052* (2013.01); *G08G 1/205* (2013.01); *H01Q 1/12* (2013.01); *G01R 31/2822* (2013.01); *G06K 2017/0045* (2013.01); *G07C 2009/0092* (2013.01)

(58) Field of Classification Search
CPC ..... G06K 19/07758; G06K 2017/0045; G06K 7/0008; G06K 7/10356; G08G 1/017; G08G 1/0104; G08G 1/052; G08G 1/205; H01Q 1/12; G07B 15/063; G07B 15/02; G06Q 10/08; G06Q 10/087; G08B 13/2417; G08B 13/2434; G08B 13/2471; G01C 21/26; G01V 15/00; G07C 2009/0092; H04Q 2209/47; H04Q 2209/75
See application file for complete search history.

(56) References Cited

U.S. PATENT DOCUMENTS

| | | | | |
|---|---|---|---|---|
| 2009/0115638 | A1* | 5/2009 | Shankwitz | G01C 21/26 340/988 |
| 2009/0143923 | A1* | 6/2009 | Breed | G08G 1/205 701/1 |
| 2009/0160646 | A1* | 6/2009 | Mackenzie | G06Q 10/08 340/572.1 |
| 2010/0176922 | A1* | 7/2010 | Schwab | G06K 7/10356 340/10.1 |
| 2010/0231389 | A1* | 9/2010 | Zank | G01V 15/00 340/572.8 |
| 2011/0017693 | A1* | 1/2011 | Thomas | B66C 13/16 212/270 |

FOREIGN PATENT DOCUMENTS

| | | |
|---|---|---|
| CN | 201673544 U | 12/2010 |
| CN | 103279774 A | 9/2013 |

* cited by examiner

SYSTEM AND METHOD FOR TESTING PERFORMANCE OF MOBILE RADIO FREQUENCY IDENTIFICATION TAG

This application is a National Stage Application of PCT/CN2014/074879, filed 8 Apr. 2014, which claims benefit of Serial No. 201310133253.1, filed 17 Apr. 2013 in China and which applications are incorporated herein by reference. A claim of priority is made to each of the above disclosed applications.

TECHNICAL FIELD

The disclosure generally relates to radio frequency technology in electronics industry, and more particularly, to a system and method for testing performance of a mobile Radio Frequency Identification (RFID) tag.

BACKGROUND

Radio Frequency Identification (RFID) is used non-contact automatic identification technology. It has merits such as the RFID tags being small and reusable, quick read-write speed, diverse shapes, long lifetime, huge storage, high recognition rate, and long recognition distance. In addition, RFID can identify multiple moving targets simultaneously. Combination of Internet and RFID technology can realize a tracking and management of goods all over the world. RFID has already been widely used in different areas such as intelligent transportation, logistics management, safety certification, real-time location, manufacturing industry and so on. It improves the efficiency of production and management and reduces the cost.

With widely use of RFID systems, requirement for RFID tags is also varied from different applications for different industries. In the RFID logistics system, when the goods pass through logistics channels, the RFID tags can be read and identified so as to sort and track the goods. However, most of the conventional logistics channels used in the logistics system are general purpose, so that the logistics channels cannot be customized individually to get the best identifying effect for different RFID tags on different goods. In a laboratory environment, a speed of the goods passing through a test channel cannot be controlled and regulated due to using a conveyor belt to carry the goods.

Therefore, it is needed to provide a technology of testing performance of RFID tags in the RFID logistics system, which can be customized individually and reach high recognition rate in a flexible way.

SUMMARY

In view of the foregoing, the present disclosure provides a simple, automatic and effective system and method for testing performance of mobile Radio Frequency Identification (RFID) tags, which can meet the requirements of individual customization on a position and an angle for antennas of a reader placed and a moving speed of under-test goods to identify all the RFID tags fixed on the goods with repeating the performance test experiment, so as to provide a reference for using the RFID tags in manufacturing lines and logistics systems.

According to one aspect of the present disclosure, a system for testing performance of mobile Radio Frequency Identification tags, comprising:

a test device including a mobile car (110) and a test channel (120); the test channel (120) comprises a magnetic label (128) on a ground for labeling a test driving route of the mobile car and a framework fixed on to the ground and provided with a reading device for the RFID tag; a magnetic recognition device is provided at a bottom of the mobile car (110) to identify to the magnetic label (128) and the mobile car (110) is driven along the test driving route; the plurality of RFID tags are fixed on under-test goods loaded on the mobile car; and a testing equipment configured to control the reading device to identify the RFID tags fixed on under-test goods;

wherein the RFID tags are fixed on to under-test goods which are loaded on the mobile car.

According to another aspect of the present disclosure, a method for testing performance of mobile RFID tags, comprising:

Step 1: installing a reader/writer and antennas for the reader/writer in a fixed way and allowing the reader/writer in an initial status;

Step 2: reading, by the reader/writer, the RFID tags of under-test goods loaded on a mobile car with different speeds with the antennas and identifying Electronic Product Code EPC contained in the RFID tags;

Step 3: recoding current test conditions when determining the EPC codes identified are correct;

Step 4: adjusting status of the reader/writer and the antennas, and repeating Step 2 to Step 3 until it is unable to adjust the status of the reader/writer and the antennas; and Step 5: starting a next test cycle, changing a test environment and repeating Step 2 to Step 4 until the test environment can't be changed.

The present disclosure provides a method and an apparatus for testing performance of the mobile RFID tags in a laboratory environment and following benefits are achieved:

1) Satisfying the requirements of individual customization. Because the reader, reader antennas and the mobile car can be adjusted and controlled, the RFID tags on the fixed position of under-test goods can be identified after repeating the performance test experiment. It has practical significance to the manufacturing applications.

2) Utilizing the moving speed of the mobile car to simulate the speed of the RFID tags passing through the logistics channel in the practical application. A simple and effective control of the speed of the under-test goods passing through the test channel is done with the mobile car in the performance test experiment. Meanwhile, the mobile car has strong maneuverability, so the RFID tags can be identified from multiple angles in a full range when the mobile car rotates 360 degrees in-situ in the test channel. Even multiple tags on multiple under-test goods can be identified simultaneously.

3) Many factors that affect the test results are considered, such as the identifying angle of the reader antennas to the RFID tags, the moving speed of the under-test goods, the test environment and so on, so that the experimental results are more reliable.

DETAILED DESCRIPTION OF EMBODIMENTS

For the object, technical solutions and advantages of the disclosure to be more clear and apparent, the disclosure will further be explained in conjunction with detailed embodiments and with reference to accompanying drawings in the following.

According to the present invention, the present disclosure provides a system and method for testing performance of mobile Radio Frequency Identification tags. According to the present disclosure, the mobile car is used to carry the under-test goods with the RFID tags fixed on. When the mobile car carries the goods and passes through the test channel equipped with the reader antennas, the reader reads the RFID tags by the reader antennas to test the performance of the RFID tags. The moving speed of the mobile car is used to simulate the speed of the RFID tags passing through the logistics channel in the practical application. With the solution of the present disclosure, the requirements of individual customization on the position and the angle the reader antennas placed with and the moving speed of under-test goods to identify all the RFID tags on the fixed position of the goods with repeating the performance test experiment so as to provide a reference for using the RFID tags in manufacturing lines and logistics systems.

Figure 1:
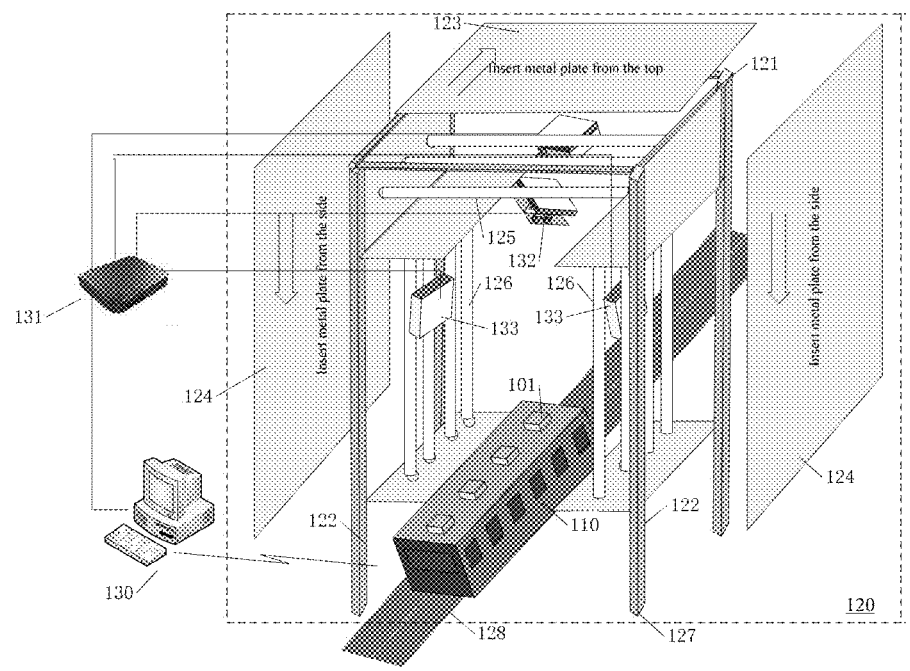
FIG. 1 is a schematic illustrating the system for testing performance of the mobile RFID tags according to the present disclosure.

FIG. 1 is a schematic illustrating the system for testing performance of the mobile RFID tags. The system may comprise: a test device, the RFID tags passing through the test device and a testing equipment.

The test device includes a mobile car 110 and a test channel 120. The test channel 120 contains a four legged structure 127, a top bracket 125, two side brackets 126 and a magnetic labeling 128. The four legged structure 127 is fixed on the ground and includes four vertical brackets placed vertically on the ground and the horizontal bracket that connects the top of the vertical brackets. The top bracket 125 consists of four adjustable axles and two boards that are placed vertically. The two boards are installed on the upper side of the left and right side of the four legged structure 127, while the top of the boards and the four apexes of the four legged structure 127 are in the same plane. The upper side of the two boards has a pair of chutes 121 for inserting the top mental plate 123 from the top. The four adjustable axles are fixed between the two boards and the reader/writer antenna 132 is installed on the axles of the top bracket 125. The side brackets 126 consist of four adjustable axles and two boards that are placed horizontally in the left and right side respectively. The two boards are installed in the middle of the left and right side of the four legged structure 127 and the top of the boards touches the bottom of the boards in the top bracket 125. The four adjustable axles are fixed between the two boards and the reader/writer antenna 133 is installed on the axles. The vertical brackets of the four legged structure 127 have a pair of chutes 122 respectively for inserting two side mental plates 124 from the left and right sides of the four legged structure 127. The top mental plate 123 is inserted along with the chutes 121 from anterior to posterior, while side mental plates 124 are inserted along with the chutes 122 from the top down. The magnetic label 128 is located on the ground, in the right middle of the four legged structure 127, indicating the test driving route from anterior to posterior for the mobile car 110.

The RFID tags 101 are fixed on under-test goods which are loaded and carried by the mobile car 110.

The testing equipment includes a computer 130, a reader/writer 131, a reader/writer antenna on a top 132 and reader/writer antennas on a side 133. The reader/writer antenna 132 is installed on the top bracket 125 and reader/writer antennas 133 are set on the side brackets 126. The computer 130 connects with the reader/writer 131 with RS232 serial port or wireless. The reader/writer antennas 132 and 133 are connected to the reader/writer 131 with serial port, while to the RFID tags with the RF connection through an air base. The computer 130 controls the reader/writer 131 to send the query command, and then the reader/writer antennas emit electromagnetic waves to request the EPC code of the RFID tags 101. The reader/writer 131 then makes an analysis of the response of the RFID tags 101.

The mobile car 110 is used to carry the under-test goods and the magnetic identification device is installed on the bottom of the mobile car to identify the magnetic label 128 on the ground. With the magnetic identification device, it moves in the test channel 120 based on the test driving route marked by the magnetic label 128. When the mobile car 110 moves to a deviated test driving route, it will adjust to the correct route on the basis of the magnetic label 128. Meanwhile, the mobile car 110 can go forward, move backward, rotate in-situ and regulate the motor speed. The mobile car 110 further contains an ARM development board and connects with a computer 130 with an RS232 serial port and wireless. A program may be downloaded to the ARM development board through the serial port from the computer 130, which realizes the initial control of the mobile car 110. In the test process, the computer 130 sends a control command to control the mobile car 110 in a wireless way.

The top bracket 125, the side brackets 126 and four legged structure 127 are made of the materials that are not sensitive to the UHF radio frequency signals. The reader/writer antenna 132 is located in the middle of the top bracket 125 and adjusts the angle of the ground by means of the adjustable axle in the top bracket 125. The reader/writer antennas 133 are placed in the side brackets 126 and adjust the distance from the ground for electromagnetic wave signals by moving up and down the adjustable axles in the side brackets 126. The reader/writer antennas 132 and 133 can be adjusted either manually or automatically by the computer 130. For example, the computer 130 uses an angle controller and distance sensors to adjust the reader/writer antennas.

The mental plates 123 and 124 are used to change the test environment and an inner surface of the mental plates 123 and 124 are covered with absorbing materials to reduce the influence on the test results for UHF radio frequency signals.

The magnetic labeling 128 is used to mark the test driving route for the mobile car 110. The mobile car 110 moves in the test channel 120 according to the test driving route marked by the magnetic label 128.

The operating frequency of the RFID tags 101 is between 860 MHz and 960 MHz. An air interface protocol between the reader 131 and the RFID tags 101 accords with the 18000-6 ISO/IEC standard. The reader 131 is a UHF reader. The response of the RFID tags 101 contains the EPC code that can be analyzed by the reader 131.

The computer 130 is a personal computer that contains a mobile car control software and a reader control and analysis software to control the mobile car 110 and the reader/writer 131. The reader control and analysis software is used to analyze the response from the under-test RFID tags 101.

Figure 2:
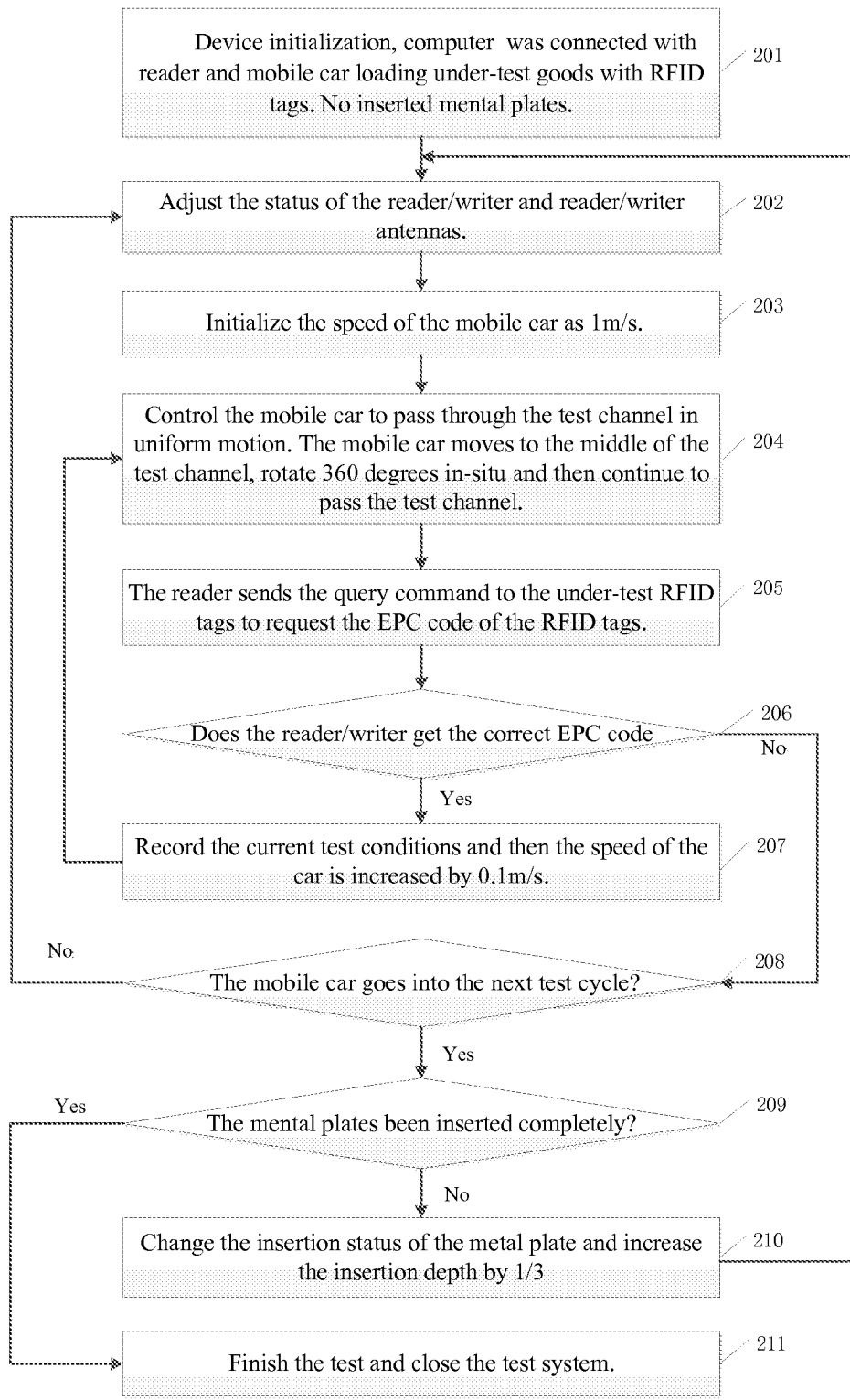
FIG. 2 is a flow diagram illustrating the method for testing performance of the mobile RFID tags according to the present disclosure.

FIG. 2 is a flow diagram illustrating the method for testing performance of the mobile RFID tags according to the present disclosure. A method for testing the performance of the mobile RFID tags using this system may comprises:

Step 201: Device initialization. A computer 130 is connected with a reader 131 and a mobile car 110. Also the mobile car 110 loads the under-test goods with the RFID tags 101. All devices are ready for work. The mental plates 123 and 124 are not inserted.

Step 202: Adjusting the status of the reader/writer 131 and the reader/writer antennas. First, the connection between the reader and the reader antennas is determined. It can be considered as the case of one reader connected to one reader antenna or one reader connected to multiple reader antennas. And then, the placement of the reader/writer antennas is determined, such as the position, the angle and the number of the reader antennas. The reader/writer antenna 132 is placed in the middle of the top bracket 125 and is adjusted by the placed angle. That is to say, the reader antenna 132 is deflected upward or downward using the horizontal plane as a benchmark. For example, from the horizontal plane, the angle of the upward deflection is increased by 5 degrees to 75 degrees every time, and then the angle of the downward deflection is increased by 5 degrees to 75 degrees. The reader/writer antenna 133 is placed in the side brackets 126 with 0 degree for the vertical axis and is adjusted by the placed height. The height of the reader/writer antenna 133 is determined by the size of the under-test goods with the RFID tags. The angle of the reader/writer antenna can be adjusted manually, or it can be adjusted automatically by the computer with an angle controller. The number of reader/writer antennas in the top and the side of the brackets is gradually increased from 1 to 4 at most.

Step 203: Initializing the speed of the mobile car 110. The computer 130 may set the initial speed of the mobile car as 1 m/s.

Step 204: Controlling the mobile car 110 to pass through the test channel. The mobile car can move to the middle of the test channel 120 in uniform motion, rotate 360 degrees in-situ and then continue to pass the test channel in uniform motion. In this way, the RFID tags 101 in the side of the under-test goods can be identified from multiple angles in a full range so as to improve an identifying rate of the RFID tags.

Step 205: The reader sends a query command to the under-test RFID tags 101. The reader requests to obtain the EPC code of the RFID tags.

Step 206: Determining whether the reader/writer has got the correct EPC code. The reader/writer 131 receives the response of the RFID tags and then sends it to the computer 130. The reader/writer control and analysis software in the computer 130 may determine whether the RFID tags have been identified or not. If a correct EPC code is obtained, go to Step 207; otherwise go to Step 208.

Step 207: Recording the current test conditions, including a speed of the mobile car 110, a connection status of the reader/writer 131 and the reader/writer antennas, the angle of the reader antenna 132, the position of the reader antenna 133 and the insertion status of the metal plate. And then the speed of the car 110 is increased by 0.1 m/s. That is to say, a step of iterative increase in the speed of the mobile car 110 is controlled to be 0.1 m/s, and the new speed of the mobile car 110 equals the sum of the current speed and 0.1 m/s and then, repeating the steps from Step 204 to Step 206.

Step 208: Determining whether the mobile car need to go into the next test cycle or not. One test cycle includes adjusting the status of the reader/writer and the reader/writer antennas and the speed of the mobile car in an invariant external test environment. Specifically, in one embodiment of the present invention, the invariant external test environment means an insertion status of the metal plate is unchanged.

The condition of entering the next test cycle is that the status of the reader and reader antennas is unable to continue to change. If the mobile car 110 enters the next test cycle, go to Step 209; otherwise, back to Step 202.

Step 209: Determining the insertion state of the metal plate. If the mental plates 123 and 124 have been inserted into the four legged structure 127 completely, go to Step 211, otherwise, go to Step 210.

Step 210: Changing the insertion status of the metal plate. The metal plates 123 and 124 are inserted into the four legged structure 127 according to the direction shown in FIG. 1, and increase the insertion depth by ⅓. Specifically, the mental plate 123 is inserted along with the chutes 121 from anterior to posterior, while the mental plates 124 are inserted along with the chutes 122 from the top to down. And then back to Step 202.

Step 211: Finishing the test and close the test system.

According to the present disclosure, a variety of different test conditions for the correct identifying of the EPC code of the RFID tags can be obtained. In practical applications, the performance test may be individual customized for the RFID tags in different goods. That is to say, an optimized test condition can be selected from the test environment for different goods, so that the RFID tags attached on the different goods will be identified effectively.

The above detailed embodiments describe the object, technical solutions and advantages of the disclosure in further detail. It shall be appreciated that the above contents are just detailed embodiments of the disclosure and are not intended to limit the disclosure. Any alternative, equivalent replacements, improvements, etc. made within the spirit and scope of the disclosure shall be encompassed by the scope of the disclosure.

What is claimed is:

1. A system for testing performance of mobile Radio Frequency Identification tags, comprising:
    a test device including a mobile car and a test channel; the test channel comprises a magnetic label on a ground for labeling a test driving route of the mobile car and a framework fixed on to the ground and provided with a reading device for the RFID tags; a magnetic recognition device is provided at a bottom of the mobile car to identify the magnetic label and the mobile car which is driven along the test driving route; the plurality of RFID tags are fixed on under-test goods loaded on the mobile car;
    a testing equipment configured to control the reading device to identify the RFID tags fixed on under-test goods;
    wherein the RFID tags are fixed on to under-test goods which are loaded on the mobile car.

2. The system according to claim 1, wherein the framework comprises a top bracket and two side brackets, the top bracket is placed horizontally on a top of the framework and the side brackets are placed in a left side and a right side of the framework vertically.

3. The system according to claim 2, wherein the reading device comprises at least one reader antenna and one reader, wherein the reader antenna is located in the top bracket and/or the side brackets.

4. The system according to claim 3, wherein the top bracket and the side brackets comprise adjustable axles in which the reader antenna is located in; and the reader antenna is adjusted manually or automatically by a computer.

5. The system according to claim 1, wherein the framework has a four legged structure, including four vertical brackets placed vertically on the ground and a horizontal bracket that connects the top of the vertical brackets;

the vertical brackets comprise chutes for inserting a mental plate from a left side and a right side of the framework;

the horizon bracket comprises chutes at a left side and a right side of respectively for inserting a mental plate from the top of the framework.

6. The system according to claim 5, wherein the inner surface of the mental plate is covered with absorbing materials to reduce the influence on the test results for UHF radio frequency signals.

7. The system according to claim 1, wherein the mobile car is configured to go forward, move backward, rotate in-situ and regulate motor speed.

8. The system according to claim 1, wherein the testing equipment includes a computer, a reader and reader antennas on the top and the side;

the computer comprises a mobile car control software and a reader control and analysis software;

the mobile car is provided with an ARM development board and connected to the computer with a RS232 serial port or wireless;

the computer sends a control command to the mobile car to control a movement of the mobile car.

9. The system according to claim 5, wherein the framework is made of the materials that are not sensitive to UHF radio frequency signals.

10. The system according to claim 4, further comprising:

there can be more than one reader antenna in the top and the side brackets;

the reader antenna located in the middle of the top bracket adjusts the angle of the ground by means of the adjustable axle in the top bracket;

the reader antennas placed in the side brackets with 0 degree for the vertical axis adjust the distance from the ground for electromagnetic wave signals by moving up and down the adjustable axles in the side brackets.

11. The system according to claim 3, further comprising:

the reader reads the RFID tags by reader antennas and identifies the EPC codes contained in RFID tags through the reader control and analysis software in the computer.

12. A method for testing performance mobile RFID tags by the system according to claim 1, comprising:

Step 1: installing a reader/writer and antennas for the reader/writer in a fixed way and allowing the reader/writer in an initial status;

Step 2: reading, by the reader/writer, the RFID tags of under-test goods loaded on a mobile car with different speeds with the antennas and identifying Electronic Product Code EPC contained in the RFID tags;

Step 3: recoding current test conditions when determining the EPC codes identified are correct;

Step 4: adjusting status of the reader/writer and the antennas, and repeating Step 2 to Step 3 until it is unable to adjust the status of the reader/writer and the antennas; and Step 5: starting a next test cycle, changing a test environment and repeating Step 2 to Step 4 until the test environment can't be changed.

13. The method according to claim 12, wherein the test conditions include test environments, a status of the reader/writer and the reader/writer antennas, and a speed of the mobile car.

14. The method according to claim 13, wherein Step 2 further comprises the mobile car moves to pass the test channel in uniform motion; the test environment is changed by inserting metal plates to the top or side brackets of the test channel; and the test environments include no metal plate, inserting a part of the metal plate and inserting the metal plate completely.

15. The method according to claim 12, wherein adjusting the status of the reader/writer and the reader/writer antennas comprises determining a state of a connection between the reader/writer and the reader antennas, and determining a placement of the reader/writer antennas.

16. The method according to claim 15, wherein the state of the connection between the reader/writer and the reader antennas/writer comprises a number of the reader/writer antennas connected to the reader/writer;

the placement of the reader/writer antennas comprises a position, an angle and a number of the reader/writer antennas.

17. The method according to claim 12, wherein the reader/writer antennas are installed on both sides and the top of the test channel; and the reader/writer reads the RFID tags by the reader/writer antennas when the mobile car passing the test channel at a set speed.

18. The method according to claim 17, wherein Step 2 further comprises increasing the speed of the mobile car from an initial speed gradually and making the mobile car pass the test channel at a corresponding set speed.

19. The method according to claim 12, wherein Step 2 further comprises the mobile car moves to a middle of the test channel in uniform motion at different speeds, rotates 360 degrees in-situ and then continues to pass the test channel in uniform motion.

20. The method according to claim 12, wherein starting the next test cycle when the status of the reader/writer and the reader/writer antennas is unable to continue to change.

* * * * *